(12) United States Patent
Li et al.

(10) Patent No.: US 11,005,056 B2
(45) Date of Patent: May 11, 2021

(54) FLEXIBLE DISPLAY PANEL AND MANUFACTURING METHOD FOR THE SAME

(71) Applicant: Wuhan China Star Optoelectronics Semiconductor Display Technology Co., Ltd., Hubei (CN)

(72) Inventors: Shunying Li, Hubei (CN); Jie Xu, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 20 days.

(21) Appl. No.: 16/303,973

(22) PCT Filed: Jun. 21, 2018

(86) PCT No.: PCT/CN2018/092203
§ 371 (c)(1),
(2) Date: Nov. 21, 2018

(87) PCT Pub. No.: WO2019/205265
PCT Pub. Date: Oct. 31, 2019

(65) Prior Publication Data
US 2019/0341565 A1 Nov. 7, 2019

(30) Foreign Application Priority Data

Apr. 28, 2018 (CN) .......................... 201810403935.2

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3246* (2013.01); *H01L 27/3258* (2013.01);
(Continued)

(58) Field of Classification Search
CPC ............ H01L 27/3246; H01L 51/0097; H01L 27/3258; H01L 27/3262; H01L 51/5253;
(Continued)

(56) References Cited

U.S. PATENT DOCUMENTS

| 2015/0069335 A1* | 3/2015 | Hsu ..................... H01L 27/3246 257/40 |
| 2016/0260928 A1* | 9/2016 | Choi .................. H01L 51/5253 |
| 2018/0337332 A1* | 11/2018 | Deng .................. H01L 27/3258 |

FOREIGN PATENT DOCUMENTS

| CN | 203883009 | 10/2014 |
| CN | 106356380 | 1/2017 |
| CN | 107611162 | 1/2018 |

* cited by examiner

*Primary Examiner* — Robert G Bachner
(74) *Attorney, Agent, or Firm* — Leong C. Lei

(57) ABSTRACT

A flexible display panel is disclosed. The panel includes: a flexible substrate; an organic material layer disposed on the flexible substrate, and the organic material layer includes multiple grooves; multiple thin-film transistors received in the multiple grooves; a planarization layer disposed on the organic material layer and the multiple thin-film transistors; a pixel definition layer disposed on the planarization layer, and including multiple openings; multiple organic light-emitting diodes received in the multiple openings; an encapsulation layer disposed on the multiple organic light-emitting diodes and the pixel definition layer. The formed organic material layer having the groove has good bending property, which can improve the stress absorption and release capability of the device, and can avoid the film from variations in the performance of the thin-film transistors (such as threshold voltage Vth, sub-threshold swing S.S, etc.) that occur during constant bending in order to increase the life of device.

5 Claims, 4 Drawing Sheets

(51) Int. Cl.
*H01L 51/52* (2006.01)
*H01L 51/56* (2006.01)
(52) U.S. Cl.
CPC ...... *H01L 27/3262* (2013.01); *H01L 51/5253* (2013.01); *H01L 51/56* (2013.01); *H01L 2227/323* (2013.01); *H01L 2251/5338* (2013.01)
(58) Field of Classification Search
CPC ............... H01L 51/56; H01L 2227/323; H01L 2251/5338; H01L 27/3244; Y02E 10/549
See application file for complete search history.

US 11,005,056 B2

FLEXIBLE DISPLAY PANEL AND MANUFACTURING METHOD FOR THE SAME

RELATED APPLICATIONS

The present application is a National Phase of International Application Number PCT/CN2018/092203, filed Jun. 21, 2018, and claims the priority of China Application No. 201810403935.2 filed Apr. 28, 2018.

FIELD OF THE INVENTION

The invention belongs to the field of flexible display technology, and more particularly to a flexible display panel and manufacturing method for the same.

BACKGROUND OF THE INVENTION

In recent years, the Organic Light-Emitting Diode (OLED) display panel has become very popular emerging flat display devices at home and abroad, because the OLED display panel has properties of self-luminous, wide viewing angle, short reaction time, high luminous efficiency, wide color gamut, low operating voltage, thin thickness, large size and capable of manufacturing flexible display panel, and simple process, and also has the potential for low cost.

Compared with the traditional rigid panel, the flexible panel has obvious advantages. It is not only thinner in volume, but also lower in power consumption than the original device, which helps to improve the endurance of the electronic device. At the same time, based on its bendable and flexible properties, it is also much more durable than hard panels, reducing the probability of accidental damage to electronic equipment. However, in the process of continuously bending the conventional flexible display panel, the stress inside the device easily changes the performance of the thin-film transistor in the device (such as the threshold voltage Vth, the sub-threshold swing SS, etc.), and it is also possible to cause delamination between layers in the device, resulting in degradation of device performance and thus reduced lifetime.

SUMMARY OF THE INVENTION

In order to solve the problems of the prior art described above, an object of the present invention to provide a flexible display panel having good bending performance and capable of improving stress release capability of a device and a manufacturing method for the same.

According to an aspect of the present invention, the present invention provides a flexible display panel, comprising: a flexible substrate; an organic material layer disposed on the flexible substrate, and the organic material layer includes multiple grooves; multiple thin-film transistors received in the multiple grooves; a planarization layer disposed on the organic material layer and the multiple thin-film transistors; a pixel definition layer disposed on the planarization layer, and including multiple openings; multiple organic light-emitting diodes received in the multiple openings; an encapsulation layer disposed on the multiple organic light-emitting diodes and the pixel definition layer.

Furthermore, the multiple grooves are corresponding to the multiple openings respectively and each groove is opposite to a corresponding one of the multiple openings.

Furthermore, each groove is received with at least one thin-film transistor and the thin-film transistor comprises: an active layer; a first insulation layer disposed on the active layer; a gate electrode disposed on the first insulation layer; a second insulation layer disposed on the gate electrode and the first insulation layer; a second metal layer disposed on the second insulation layer; an interlayer insulation layer disposed on the second insulation layer and the second metal layer, a source electrode and a drain electrode disposed on the interlayer insulation layer, wherein the source electrode and the drain electrode respectively penetrate the interlayer insulation layer, the second insulation layer, and the first insulation layer to respectively contact with the active layer.

Furthermore, each opening is received with an organic light-emitting diode and the organic light-emitting diode comprises: an anode that penetrates the planarization layer to contact with the drain electrode; an organic light-emitting function layer disposed on the anode; and a cathode disposed on the organic light-emitting function layer.

Furthermore, the flexible display panel further comprises: multiple supporting bodies disposed on the pixel definition layer and the encapsulation layer.

According to another aspect of the present invention, the present invention also provides a manufacturing method for flexible display panel, comprising steps of: forming an organic material layer including multiple grooves on a flexible substrate; forming a thin-film transistor in each of the multiple groove; forming a planarization layer on the organic material layer and the multiple thin-film transistors; forming a pixel definition layer including multiple openings on the planarization layer; forming an organic light-emitting diode in the opening; and forming an encapsulation layer on multiple organic light-emitting diodes and the pixel definition layer.

Furthermore, the step of forming a thin-film transistor in each of the multiple grooves comprises steps of: forming an active layer in the groove; forming a first insulation layer on the active layer; forming a gate electrode on the first insulation layer; forming a second insulation layer on the gate electrode and the first insulation layer; forming a second metal layer on the second insulation layer; forming an interlayer insulation layer on the second insulation layer and the second metal layer; and forming a source electrode and a drain electrode that penetrates the interlayer insulation layer, the second insulation layer, and the first insulation layer to contact with the active layer on the interlayer insulation layer.

Furthermore, the step of forming an organic light-emitting diode in the opening comprises steps of: forming an anode that penetrates the planarization layer to contact with the thin-film transistor in the opening; forming an organic light-emitting function layer on the anode; and forming a cathode on the organic light-emitting function layer.

Furthermore, before the step of forming an encapsulation layer on multiple organic light-emitting diodes and the pixel definition layer, the method further comprises a step of: forming multiple supporting bodies on the pixel definition layer.

Beneficial effect of the present invention, according to the flexible display panel of the embodiment of the present invention, the formed organic material layer having the groove has good bending property, which can improve the stress absorption and release capability of the device, and can avoid the film from variations in the performance of the thin-film transistors (such as threshold voltage Vth, sub-threshold swing S.S, etc.) that occur during constant bending. The present invention is not easily to generate device breakage and film delamination, which increases the life of the device. In addition, the organic material layer with grooves can both shield the water vapor and oxygen, and avoid the electrical signal interference between adjacent thin-film transistors.

BRIEF DESCRIPTION OF THE DRAWINGS

Through following to combine figures to describe in detail, the above, the other purposes, the features and benefits of the exemplary embodiment of the present disclosure will become clearer, in the figures.

DETAILED DESCRIPTION OF PREFERRED EMBODIMENTS

The following content combines with the drawings and the embodiment for describing the present invention in detail. However, many other forms can be used to implement the present invention. Besides, the present invention should not be interpreted to be limit in the specific embodiment described here. On the contrary, the embodiments provided here are used for explaining the operation principle and practical application such that person skilled in the art can under various embodiments of the present invention and various modification suitable for specific applications.

In the figures, in order to illustrate the devices clearly, thickness of the layers and regions are enlarged. A same numeral in the entire specification and figures represents a same device.

It will be understood that when an element such as a layer, a film, a region or a substrate is referred to as "on" or "formed on" another element, the element may be directly on or formed on another element. Or there may be intermediate components as well. Alternatively, when an element is referred to as being "directly on" or "directly formed on" another element, there is no intermediate element.

Figure 1:
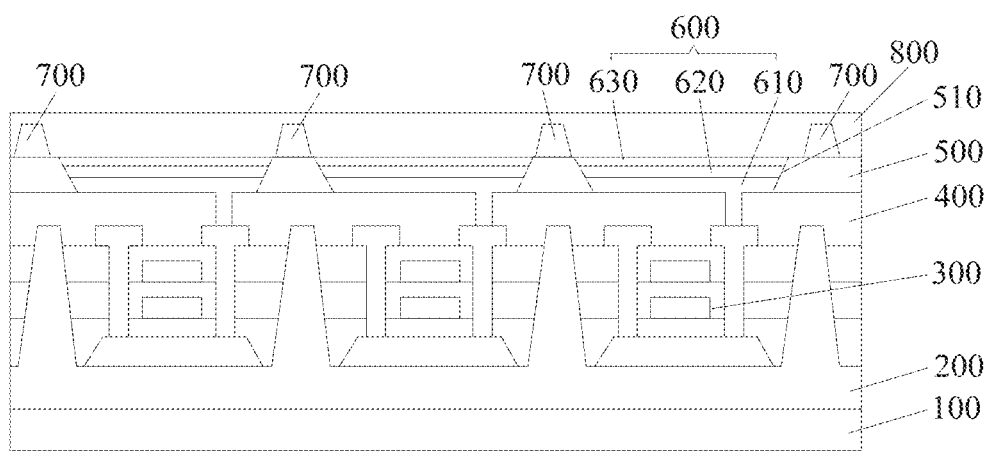
FIG. 1 is a schematic structural view of a flexible display panel according to an embodiment of the present invention.

FIG. 1 is a schematic structural diagram of a flexible display panel according to an embodiment of the present invention.

Referring to FIG. 1, a flexible display panel according to an embodiment of the present invention includes a flexible substrate 100, an organic material layer 200, multiple thin-film transistors 300, a planarization layer 400, a pixel definition layer 500, multiple organic light-emitting diodes 600, and multiple supporting bodies 700 and an encapsulation layer 800.

Specifically, the flexible substrate 100 may be made of, for example, polyimide, but the invention is not limited thereto. The organic material layer 200 is disposed on the flexible substrate 100.

The organic material layer 200 is electrically insulated and has a good ability to block moisture and oxygen. The organic material layer 200 includes multiple grooves 210, and openings of the multiple grooves 210 are away from the flexible substrate 100. As an embodiment of the present invention, the multiple grooves 210 may be arranged as a matrix, but the present invention is not limited thereto.

Each groove 210 is received with at least one thin-film transistor 300. As an embodiment of the present invention, the thin-film transistor 300 includes an active layer 310, a first insulation layer 320 disposed on the active layer 310, a gate electrode 330 disposed on the first insulation layer 320, and a second insulation layer 340 disposed on the gate electrode 330 and the first insulation layer 320. A second metal layer 350 disposed on the second insulation layer 340, an interlayer insulation layer 360 disposed on the second insulation layer 340 and the second metal layer 350, a source electrode 370 and a drain electrode 380 disposed on the interlayer insulation layer 360. Wherein the source electrode 370 and the drain electrode 380 respectively penetrate the interlayer insulation layer 360, the second insulation layer 340, and the first insulation layer 320 to respectively contact with the active layer 310. Here, the structure of the thin-film transistor 300 is merely an example, and the structure of the thin-film transistor of the present invention is not limited thereto, and it may be any conventional thin film transistor used in a display panel.

In the present embodiment, the active layer 310 may be made of, for example, polysilicon, but the invention is not limited thereto. In addition, the gate electrode 330 and the second metal layer 350 form a capacitor, wherein the gate electrode 330 is used as a gate electrode of the transistor, and can be used as one electrode of the capacitor, and the second metal layer 350 is used as the other electrode of the capacitor. As another embodiment of the present invention, when a capacitor is not required, the corresponding second metal layer 350 may be omitted, and the corresponding interlayer insulation layer 360 or the second insulation layer 340 may also be omitted.

The planarization layer 400 is disposed on the organic material layer 200 and the multiple transistors 300 for planarization.

The pixel definition layer 500 is disposed on the planarization layer 400. The pixel definition layer 500 includes multiple openings 510. Furthermore, the openings 510 are corresponding to the grooves 210 respectively, and each of the openings 510 is opposite to or directly opposite to a corresponding one of the grooves 210. That is, a projection of the opening 510 in the groove 210 is located within the groove 210, that is, a groove wall of the groove 210 is located between adjacent two openings 510, thereby preventing the groove wall from affecting the light transmission effect of the opening 510.

Each of the openings 510 is received with an organic light-emitting diode 600. In the present embodiment, the organic light-emitting diode 600 includes an anode 610 that penetrates the planarization layer 400 to contact with the drain electrode 380, an organic light-emitting function layer 620 disposed on the anode 610, and a cathode 630 disposed on the organic light-emitting function layer 620. One of the anode 610 and the cathode 630 is reflective and the other is light transmissive. The organic light-emitting function layer 620 includes, in order from the anode 610 to the cathode 630, a hole generation layer, a hole transport layer, an organic light-emitting layer, an electron transport layer, and an electron injection layer, but the structure of the organic light-emitting function layer 620 of the present invention is not limited.

In addition, the organic light-emitting diode 600 may be a red organic light-emitting diode, a green organic light-emitting diode, or a blue organic light-emitting diode, and the multiple organic light-emitting diodes 600 include at least one red organic light-emitting diode, at least one green organic light-emitting diode and at least one blue organic light-emitting diode.

Multiple supporting bodies 700 are disposed on the pixel definition layer 500. In the present embodiment, the supporting bodies 700 may be made of, for example, a polystyrene material, but the invention is not limited thereto. The role of the supporting body 700 is to prevent a mask from contacting with the substrate during the vapor deposition of the film layer, thereby preventing the substrate from being scratched. Therefore, as another embodiment of the present invention, the supporting body 700 may be omitted.

The encapsulation layer 800 is disposed on the pixel definition layer 500, the multiple organic light-emitting diodes 600, and the multiple supporting bodies 700. The encapsulation layer 800 has a better ability to insulate moisture and oxygen in order to prevent surface moisture and oxygen from etching the organic light emitting diodes 600.

In summary, according to the flexible display panel of the embodiment of the present invention, the formed organic material layer having the groove has good bending property, which can improve the stress absorption and release capability of the device, and can avoid the film from variations in the performance of the thin-film transistors (such as threshold voltage Vth, sub-threshold swing S.S, etc.) that occur during constant bending. The present invention is not easily to generate device breakage and film delamination, which increases the life of the device. In addition, the organic material layer with grooves can both shield the water vapor and oxygen, and avoid the electrical signal interference between adjacent thin-film transistors.

A manufacturing method for a flexible display panel according to an embodiment of the present invention will be described in detail below. FIG. 2A to FIG. 2G are process diagrams of a flexible display panel in accordance with an embodiment of the present invention.

Figure 2A:
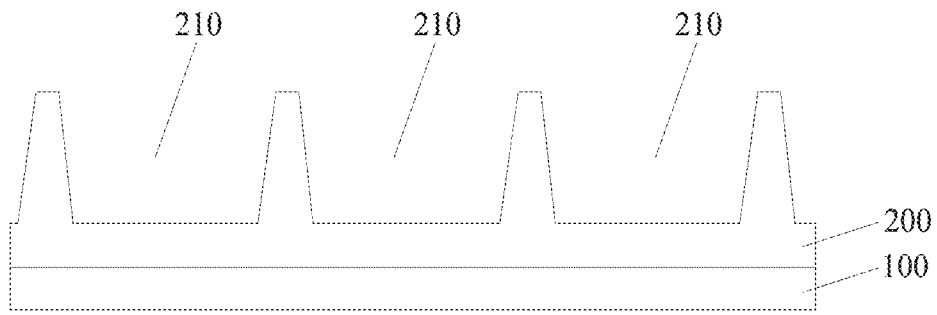
FIG. 2A through FIG. 2G are process diagrams of a flexible display panel in accordance with an embodiment of the present invention.

Step 1: referring to FIG. 2A, forming an organic material layer 200 including multiple grooves 210 on a flexible substrate 100. Specifically, firstly, coating an organic layer on the flexible substrate 100; then, forming multiple grooves 210 in the organic layer by exposing, developing, etching, or the like in order to form the organic material layer 200.

Figure 2B:
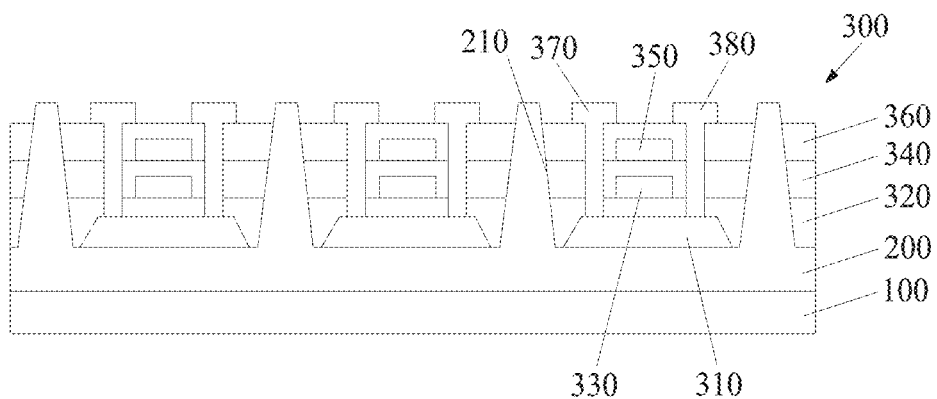

Step 2: referring to FIG. 2B, forming a thin-film transistor 300 in the groove 210.

Here, a specific method of forming the thin-film transistor 300 includes: first, forming an active layer 310 in the groove 210; secondly, forming a first insulation layer 320 on the active layer 310; then, forming a gate electrode 330 on the first insulation layer 320; then, forming a second insulation layer 340 on the gate electrode 330 and the first insulation layer 320; then, forming a second metal layer 350 on the second insulation layer 340; then, forming an interlayer insulation layer 360 on the second insulation layer 340 and the second metal layer 350; then, forming a source electrode 370 and a drain electrode 380 that penetrates the interlayer insulation layer 360, the second insulation layer 340, and the first insulation layer 320 to contact with the active layer 310 on the interlayer insulation layer 360.

Here, as another embodiment of the present invention, when the second metal layer 350 is not existed, the corresponding steps may be omitted. Identically, when the interlayer insulation layer 360 or the second insulation layer 340 is not present, the corresponding steps may be omitted.

Figure 2C:
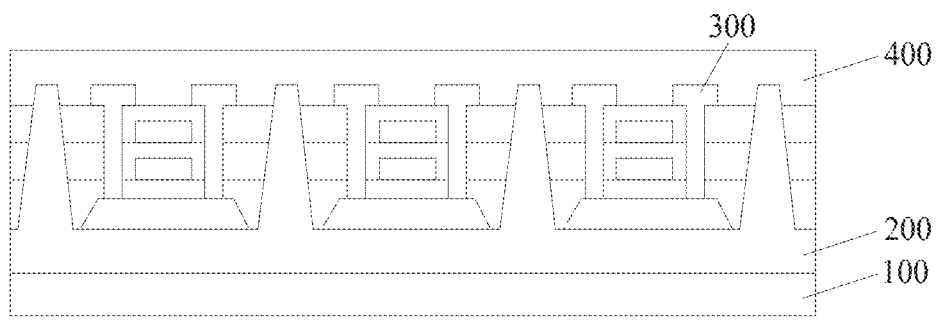

Step 3: referring to FIG. 2C, forming a planarization layer 400 on the organic material layer 200 and the multiple thin-film transistors 300. Here, the planarization layer 400 has an effect of flattening.

Figure 2D:
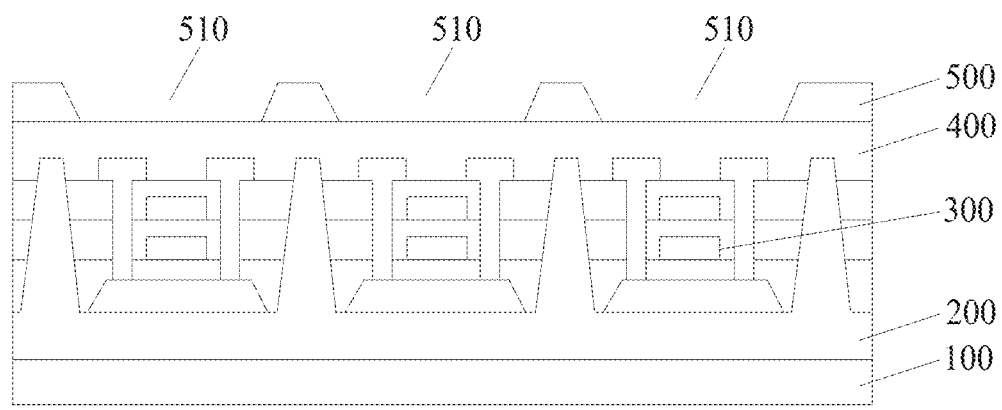

Step 4: referring to FIG. 2D, forming a pixel definition layer 500 including multiple openings 510 on the planarization layer 400. Here, the openings 510 are respectively corresponding to the grooves 210, and each opening 510 is opposite to or directly opposite to a corresponding one of the grooves 210. That is, a projection of the opening 510 in the groove 210 is located within the groove 210, that is, the groove wall of the groove 210 is located between the adjacent two openings 510 in order to prevent the groove wall from affecting the light transmission effect of the opening 510.

Figure 2E:
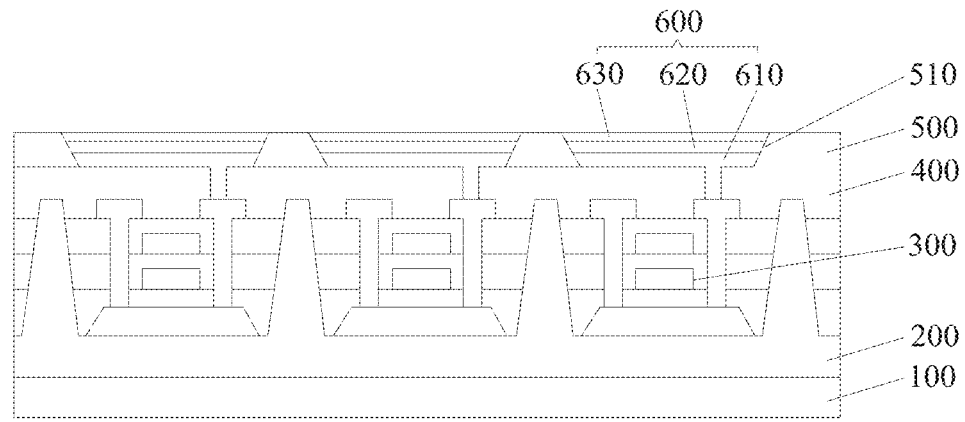

Step 5: referring to FIG. 2E, forming an organic light-emitting diode 600 in the opening 510.

Here, a specific method of forming the organic light-emitting diode 600 includes firstly, forming an anode 610 that penetrates the planarization layer 400 to contact with the drain electrode 380 of the thin-film transistor 300 in the opening 510; secondly, forming an organic light-emitting function layer on the anode 610 Finally, forming a cathode 630 on the organic light-emitting function layer 620. As another embodiment of the present invention, the step of forming the anode 610 can be performed between the step 3 and the step 4.

Figure 2F:
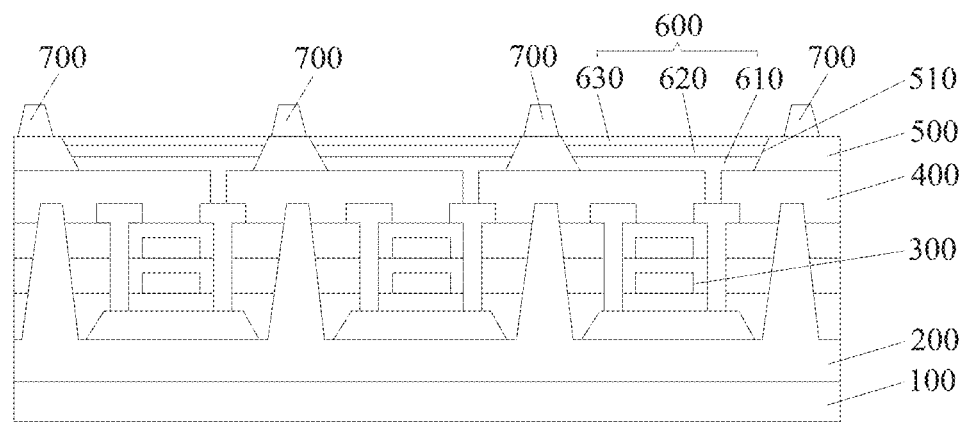

Step 6: referring to FIG. 2F, forming multiple supporting bodies 700 on the pixel definition layer 500. As another embodiment of the present invention, when the supporting body 700 is not existed, the step 6 may be omitted.

Figure 2G:
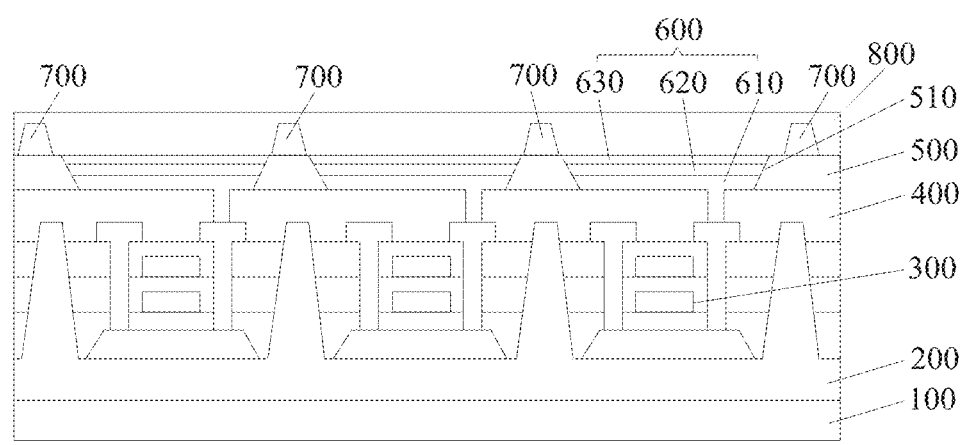

Step 7: referring to FIG. 2G, forming an encapsulation layer 800 on the pixel definition layer 500, the multiple organic light-emitting diodes 600, and the multiple supporting bodies 700.

In summary, according to the flexible display panel and the manufacturing method of the embodiment of the present invention, the formed organic material layer having the groove has good bending property, which can improve the stress absorption and release capability of the device, and can avoid the film from variations in the performance of the thin-film transistors (such as threshold voltage Vth, sub-threshold swing S.S, etc.) that occur during constant bending. The present invention is not easily to generate device breakage and film delamination, which increases the life of the device. In addition, the organic material layer with grooves can both shield the water vapor and oxygen, and avoid the electrical signal interference between adjacent thin-film transistors.

The above embodiments of the present invention are only exemplary, however, the present invention is not limited. The person skilled in the art can understand: without exceeding the principle and spirit of the present invention, the above embodiments can be improved, wherein the scope of the present invention is limited in the claims and the equivalents of the claims.

What is claimed is:

1. A flexible display panel, comprising:
   a flexible substrate;
   an organic material layer disposed on the flexible substrate, and the organic material layer includes multiple grooves;
   multiple thin-film transistors received in the multiple grooves;
   a planarization layer disposed on the organic material layer and the multiple thin-film transistors;
   a pixel definition layer disposed on the planarization layer, and including multiple openings;
   multiple organic light-emitting diodes received in the multiple openings;
   an encapsulation layer disposed on the multiple organic light-emitting diodes and the pixel definition layer;
   wherein each groove is received with at least one thin-film transistor and the thin-film transistor comprises:
   an active layer;
   a first insulation layer disposed on the active layer;
   a gate electrode disposed on the first insulation layer;

a second insulation layer disposed on the gate electrode and the first insulation layer;

a second metal layer disposed on the second insulation layer;

an interlayer insulation layer disposed on the second insulation layer and the second metal layer;

a source electrode and a drain electrode disposed on the interlayer insulation layer, wherein the source electrode and the drain electrode respectively penetrate the interlayer insulation layer, the second insulation layer, and the first insulation layer to respectively contact with the active layer.

2. The flexible display panel according to claim 1, wherein the multiple grooves are corresponding to the multiple openings respectively and each groove is opposite to a corresponding one of the multiple openings.

3. The flexible display panel according to claim 1, wherein each opening is received with an organic light-emitting diode and the organic light-emitting diode comprises:

an anode that penetrates the planarization layer to contact with the drain electrode;

an organic light-emitting function layer disposed on the anode; and a cathode disposed on the organic light-emitting function layer.

4. The flexible display panel according to claim 2, wherein each opening is received with an organic light-emitting diode and the organic light-emitting diode comprises:

an anode that penetrates the planarization layer to contact with the drain electrode;

an organic light-emitting function layer disposed on the anode; and a cathode disposed on the organic light-emitting function layer.

5. The flexible display panel according to claim 1, wherein the flexible display panel further comprises: multiple supporting bodies disposed on the pixel definition layer and the encapsulation layer.

\* \* \* \* \*